US006618835B1

United States Patent
Garlapati et al.

(10) Patent No.: US 6,618,835 B1
(45) Date of Patent: Sep. 9, 2003

(54) TRANSFORMING A CIRCUIT HAVING LOOP STRUCTURE AND TRI-STATE ELEMENT USING REPLICATION

(75) Inventors: Krishna Garlapati, Santa Clara, CA (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 0 days.

(21) Appl. No.: 09/949,219

(22) Filed: Sep. 7, 2001

(51) Int. Cl.[7] .................................................. G06F 17/50
(52) U.S. Cl. ................................. 716/3; 716/16; 716/4
(58) Field of Search .............................. 716/3–8, 16–18; 326/58, 59; 327/211, 210; 365/230.08

(56) References Cited

U.S. PATENT DOCUMENTS

| | | | | |
|---|---|---|---|---|
| 6,154,056 A | * | 11/2000 | Casper | 326/58 |
| 6,211,713 B1 | * | 4/2001 | Uhlmann | 327/211 |
| 6,334,208 B1 | * | 12/2001 | Erickson | 716/17 |
| 6,345,012 B1 | * | 2/2002 | Casper | 365/230.08 |
| 6,374,380 B1 | * | 4/2002 | Sim | 714/727 |
| 6,449,751 B1 | * | 9/2002 | Hussain et al. | 716/4 |
| 6,470,485 B1 | * | 10/2002 | Cote et al. | 716/16 |

* cited by examiner

*Primary Examiner*—Vuthe Siek
*Assistant Examiner*—Binh Tat
(74) *Attorney, Agent, or Firm*—Blakely, Sokoloff, Taylor & Zafman LLP

(57) ABSTRACT

One embodiment of the present invention identifies a circuit having a loop structure and a tri-state element. The circuit provides a circuit output. The loop structure contains at least a loop element in a feedback connection. The tri-state element receives first tri-state inputs. The circuit is transformed so that the tri-state element is moved across the loop structure to provide the circuit output.

30 Claims, 7 Drawing Sheets

TRANSFORMING A CIRCUIT HAVING LOOP STRUCTURE AND TRI-STATE ELEMENT USING REPLICATION

BACKGROUND

1. Field of the Invention

This invention relates to digital circuits. In particular, the invention relates to design synthesis.

2. Description of Related Art

Tri-state devices are useful in digital circuits to protect a circuit element from logic contention. A tri-state device has basically two modes of operation: enable mode and disable mode. In the enable mode, the tri-state device generates a logic output, either LOW or HIGH, depending on the data input. In the disable mode, the tri-state device generates a high impedance state regardless of the data input.

A Hardware Description Language (HDL) such as Verilog or Very High Speed Integrated Circuits Hardware Description Language (VHDL) can model a tri-state device. For example, VHDL can model a tri-state device using high impedance value as a literal encoding under a condition. However, when the tri-state device is connected to a circuit that may propagate the high impedance value of the output of the tri-state device under some circuit conditions, the modeling or synthesis becomes difficult. When the circuit has a loop structure which has one or more feedback connections, the synthesis or modeling of such a circuit has not been adequately dealt with. Typically, a circuit may be modeled by a number of processes. Most existing synthesis tools implement each process independently. However, they implement the tri-state behavior correctly only to the boundary of the process. When the high impedance values are passed from one process to another, the high impedance state is lost.

Therefore, there is a need to have an efficient technique to synthesize a circuit having a loop structure and a tri-state device.

BRIEF DESCRIPTION OF THE DRAWINGS

The features and advantages of the present invention will become apparent from the following detailed description of the present invention in which.

DESCRIPTION

One embodiment of the present invention is a design synthesis tool to transform a circuit using replication of circuit elements. The circuit is first synthesized into a network of symbolic circuit elements such that the tri-state behavior of the circuit is preserved. The circuit elements that are used have a special behavior that would be difficult and impractical to realize in real circuit elements. The behavior would not be possible in existing Field Programmable Gate Array (FPGA) and Applications Specific Integrated Circuits (ASIC) libraries. The circuit is therefore not suitable for direct mapping to a target technology. The difference is that selection and storage circuit elements are defined to propagate and store the high impedance state. After the transformation, the special tri-state behavior of the selection and storage circuit elements can be dropped while maintaining the correct functioning of the circuit. The technique identifies a circuit which has a circuit output and contains a loop structure and a tri-state element. The loop structure propagates a tri-state output of the tri-state element. The tri-state element receives first tri-state inputs. The loop structure includes a loop element having a feedback connection. The loop structure is then transformed to generate second tri-state inputs. The transformed loop structure receives the first tri-state inputs. The tri-state element is moved to the output side of the transformed loop structure to receive the second tri-state inputs. The moved tri-state element generates the circuit output.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
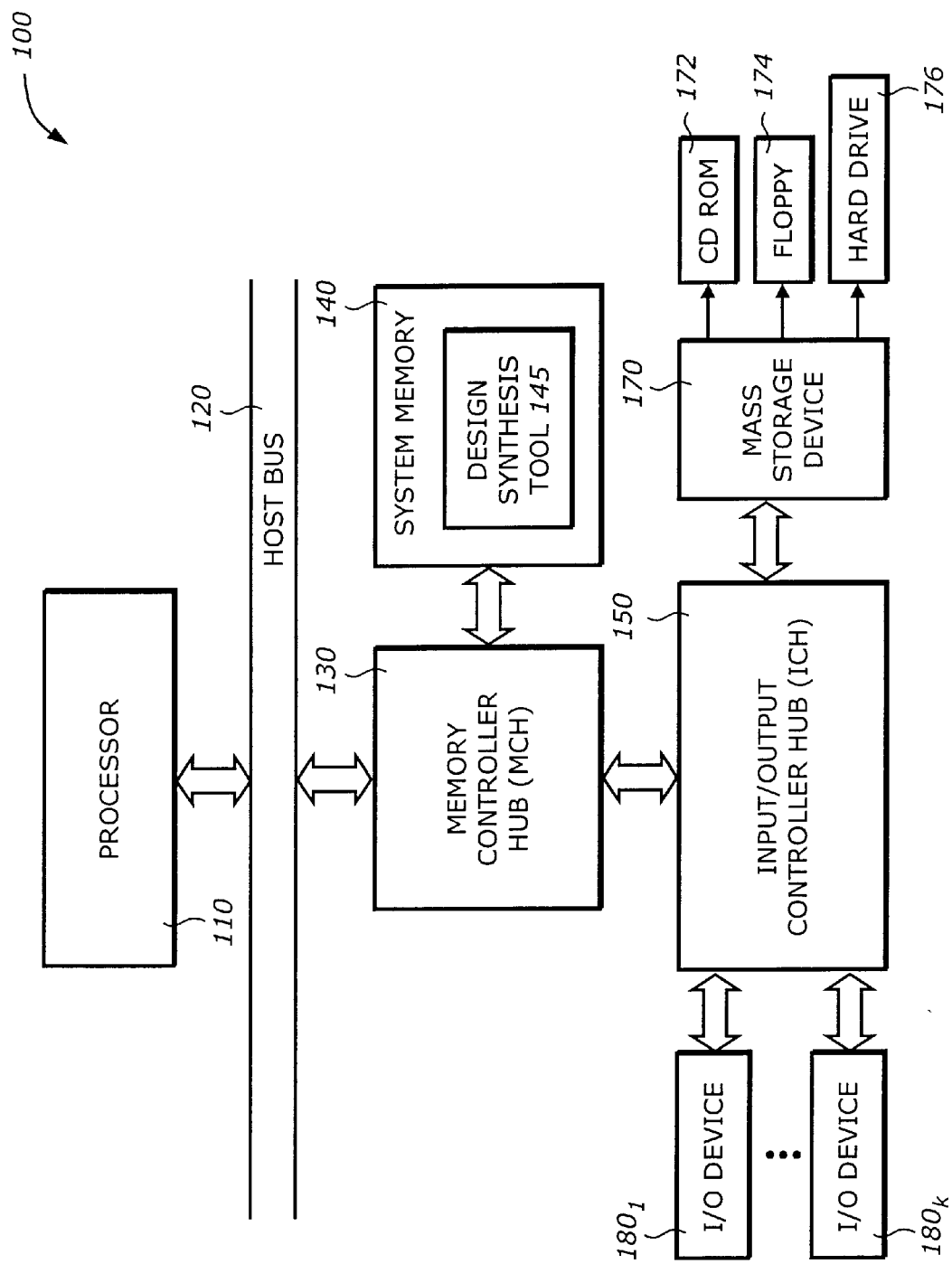
FIG. 1 is a diagram illustrating a system in which one embodiment of the invention can be practiced.

FIG. 1 is a diagram illustrating a computer system 100 in which one embodiment of the invention can be practiced. The computer system 100 includes a processor 110, a host bus 120, a memory control hub (MCH) 130, a system memory 140, an input/output control hub (ICH) 150, a mass storage device 170, and input/output devices $180_1$ to $180_K$.

The processor 110 represents a central processing unit of any type of architecture, such as embedded processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. In one embodiment, the processor 110 is compatible with Intel Architecture (IA) processors. The host bus 120 provides interface signals to allow the processor 110 to communicate with other processors or devices, e.g., the MCH 130. The host bus 120 may support a uni-processor or multiprocessor configuration. The host bus 120 may be parallel, sequential, pipelined, asynchronous, synchronous, or any combination thereof.

The MCH 130 provides control and configuration of memory and input/output devices such as the system memory 140 and the ICH 150. The MCH 130 may be integrated into a chipset that integrates multiple functionalities such as the isolated execution mode, host-to-peripheral bus interface, memory control. For clarity, not all the peripheral buses are shown. It is contemplated that the system 100 may also include peripheral buses such as Peripheral Component Interconnect (PCI), accelerated graphics port (AGP), Industry Standard Architecture (ISA) bus, and Universal Serial Bus (USB), etc.

The system memory 140 stores system code and data. The system memory 140 is typically implemented with dynamic random access memory (DRAM) or static random access memory (SRAM). The system memory may include program code or code segments implementing one embodiment of the invention. The system memory includes a design synthesis tool 145. The design synthesis tool 145 may also be implemented by hardware, software, firmware, microcode, or any combination thereof. The system memory 140 may also include other programs or data which are not shown, such as an operating system.

The ICH 150 has a number of functionalities that are designed to support I/O functions. The ICH 150 may also be integrated into a chipset together or separate from the MCH 130 to perform I/O functions. The ICH 150 may include a number of interface and I/O functions such as PCI bus interface, processor interface, interrupt controller, direct memory access (DMA) controller, power management logic, timer, universal serial bus (USB) interface, mass storage interface, low pin count (LPC) interface, etc.

The mass storage device 170 stores archive information such as code, programs, files, data, applications, and operating systems. The mass storage device 170 may include compact disk (CD) ROM 172, floppy diskettes 174, and hard drive 176, and any other magnetic or optic storage devices. The mass storage device 170 provides a mechanism to read machine-readable media.

The I/O devices $180_1$ to $180_K$ may include any I/O devices to perform I/O functions. Examples of I/O devices $180_1$ to $180_K$ include controller for input devices (e.g., keyboard, mouse, trackball, pointing device), media card (e.g., audio, video, graphics), network card, and any other peripheral controllers.

The present invention may be implemented by hardware, software, firmware, microcode, or any combination thereof. When implemented in software, firmware, or microcode, the elements of the present invention are the program code or code segments to perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc. The program or code segments may be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

It is noted that the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be rearranged. A process is terminated when its operations are completed. A process may correspond to a method, a function, a procedure, a subroutine, a subprogram, etc. When a process corresponds to a function, its termination corresponds to a return of the function to the calling function or the main function. In the description that follows, the term "net" refers to a link, a connection, or a wiring to connect one terminal to another terminal, or one pin of a device to another pin of the same device or another device. In addition, the terms "input" and "output" typically refer to signals or signal lines acting as an input to a device and an output from a device, respectively.

Figure 2:
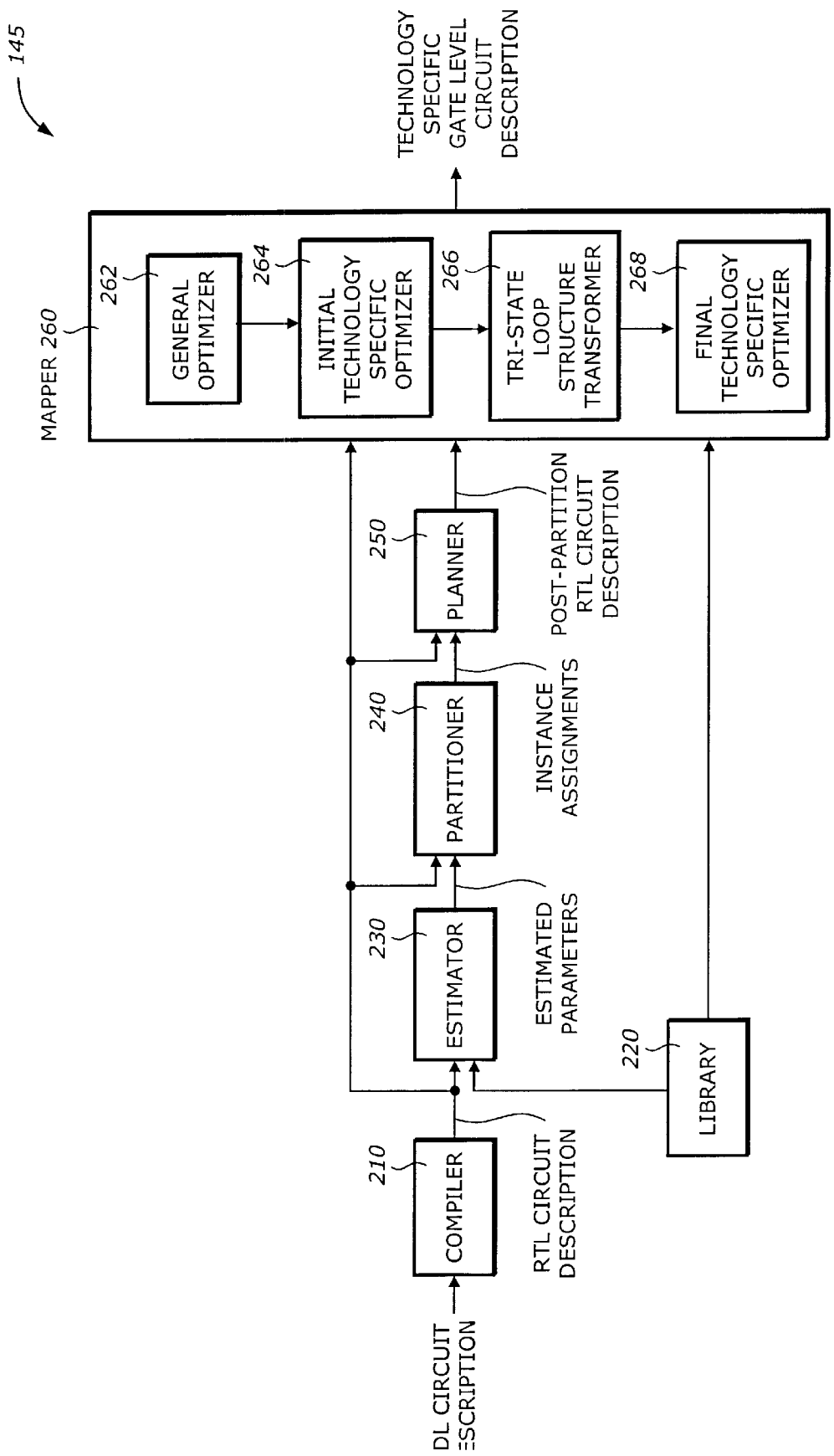
FIG. 2 is a diagram illustrating a design synthesis tool shown in FIG. 1 according to one embodiment of the invention.

FIG. 2 is a diagram illustrating a design synthesis tool 145 shown in FIG. 1 according to one embodiment of the invention. The design synthesis tool 145 includes a compiler 210, a library 220, an estimator 230, a partitioner 240, a planner 250, and a mapper 260. Note that this is only for illustrative purposes. The design synthesis tool 100 may have more or less components than listed above. For example, the design synthesis tool 100 may include the compiler 210, the library 220, and the mapper 260. The design synthesis tool 100 may be a software package in a computer aided design (CAD) environment. The design synthesis tool 100 is used by design engineers for designing, synthesizing, and simulating a circuit or a project. The design synthesis tool 100 is usually as part of a design process for a programmable device such as programmable logic devices (PLD), complex PLD (CPLD), field programmable logic array (FPGA), etc.

The compiler 210 compiles a source program containing a hardware description language (HDL) circuit description. The HDL may be any appropriate HDL such as Very High Speed Integrated Circuit Hardware Description Language (VHDL) or Verilog. The compiler 210 generates a register transfer level (RTL) circuit description from the HDL circuit description. The library 220 contains previously compiled circuit descriptions, vendors' circuit descriptions, functions, packages, or any other useful components that can be linked, combined, and integrated with the current RTL circuit description. The estimator 230 estimates functional and/or physical parameters related to the circuit or project. Some examples of the parameters include the circuit complexity (e.g., number of gates), circuit size, power consumption, overall timings, etc. The estimator 230 receives the RTL circuit description from the compiler 210 and other information from the library 220 to generate the estimated parameters.

The partitioner 250 generates instance assignments based on the RTL circuit description and the estimated parameters. The planner 250 generates post-partition RTL circuit description from the RTL circuit description and the instance assignments.

The mapper 260 generates technology-specific gate level circuit description from the post-partition RTL circuit description and other useful information from the library 220. The mapper 260 may also generates the technology-specific gate level circuit description directly from the RTL circuit description and the library information. The mapper 260 includes a general optimizer 262, an initial technology specific optimizer 264, a tri-state loop structure transformer 266, and a final technology specific optimizer 268. The general optimizer 262 optimizes the gate level circuit description without considering the specific technology or device that the circuit will eventually be implemented. The initial technology specific optimizer 264 performs the initial optimization based on the general optimization. The final technology specific optimizer 268 generates the final optimized gate level circuit description specifically for the technology to be used such as the specific selected device. The final optimized gate level circuit description may then be simulated and downloaded into the specific device for physical implementation.

It is noted that the process described in the following is applicable to any circuit representation including the actual circuit transformation, symbolic representation, original source code, and intermediate structures between original source code and circuit structures.

Figure 3A:
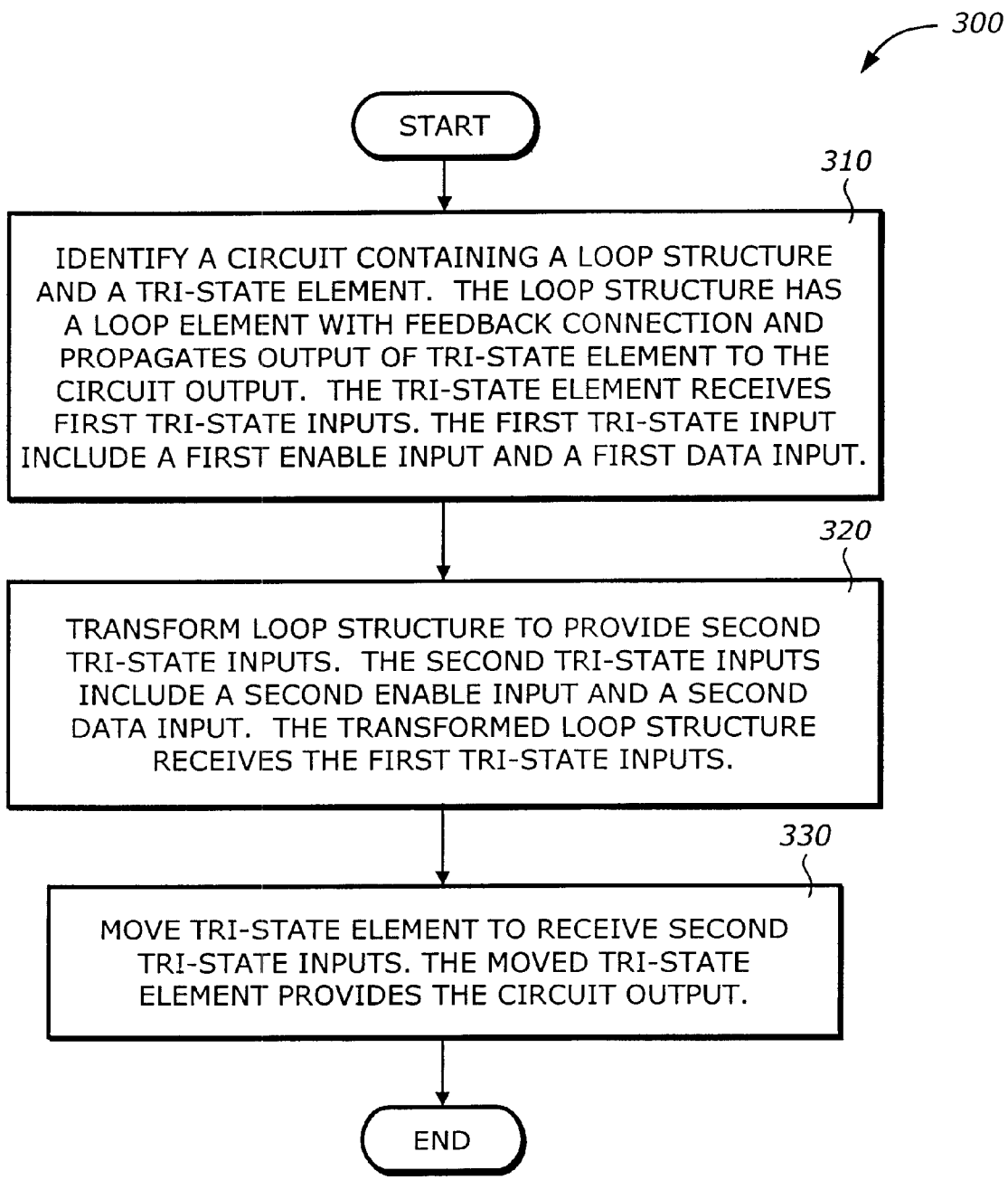
FIG. 3A is a flowchart illustrating a process for tri-state transformation shown in FIG. 2 according to one embodiment of the invention.

FIG. 3A is a flowchart illustrating a process 300 for the tri-state transformer 266 shown in FIG. 2 according to one embodiment of the invention. In essence, the transformation includes replication of loops to separate the data path and the enable path so that the tri-state can be pushed (or moved). Although the replicated loops or elements may be an object of any size, the corresponding enable path retains the original width, e.g., one bit.

Upon START, the process 300 identifies a circuit containing a loop structure and a tri-state element (Block 310). The circuit provides a circuit output. The loop structure includes at least a loop element that is any circuit structure that has a feedback connection. The loop element is a combinational or sequential circuit or any combination of combinational and sequential circuits that can propagate the output of the tri-state element to the circuit output. Examples of the loop element are multiplexers, logic gates, buffers, latches, registers, and flip-flops. The tri-state element receives the first tri-state inputs. The first tri-state inputs include a first enable input and a first data input. The tri-state element may include a number of devices such as logic gates, a series of tri-state devices connected in cascade. The first tri-state inputs may include multiple enable inputs.

Then, the process 300 transforms the loop structure to provide the second tri-state inputs (Block 320). The second tri-state inputs include at least a second enable input and a second data input. The transformed loop structure receives the first tri-state inputs. The details of transforming the loop structure is described in FIG. 3B.

Next, the process 300 moves the tri-state element to the output of the transformed loop structure so that the tri-state element now receives the second tri-state inputs (Block 330). The tri-state element provides the circuit output. Then, the process 300 is terminated.

Figure 3B:
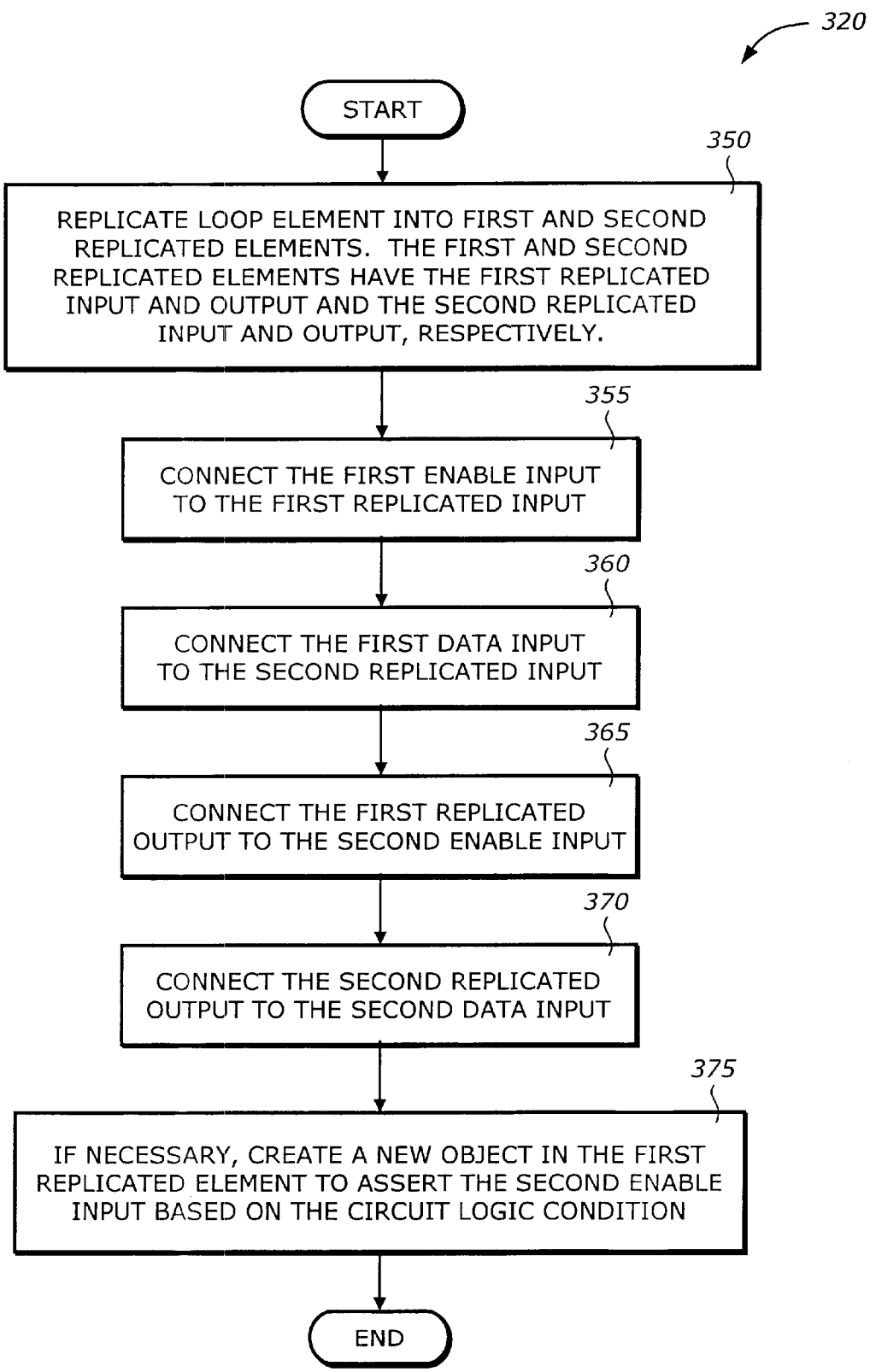
FIG. 3B is a flowchart illustrating the process to transform the loop structure as shown in FIG. 3A according to one embodiment of the invention.

FIG. 3B is a flowchart illustrating the process 320 to transform the loop structure as shown in FIG. 3A according to one embodiment of the invention.

Upon START, the process 320 replicates the loop element into first and second replicated elements (Block 350). The original inputs to the loop elements are likewise replicated. Typically, the internal structure of the loop element remains essentially the same in each of the replicated elements. The first replicated element has a first replicated input and a first replicated output. The second replicated element has a second replicated input and a second replicated output.

Next, the process 320 connects the first enable input to the first replicated input (Block 355). Then, the process 320 connects the first data input to the second replicated input (Block 360). In other words, the two tri-state inputs are distributed to the two replicated elements. The two replicated elements are used to generate the new tri-state inputs (e.g., the second tri-state inputs) to the tri-state element. Next, the process 320 connects the first replicated output to the first enable input (Block 365). Then, the process 320 connects the second replicated output to the first data input (Block 370).

Next, the process 320 creates a new object in the first replicated element such that the first replicated element asserts the second enable input based on the circuit logic condition (Block 375). The new object may include a logic gate, a combinational circuit, and a connection of to a logic level (e.g., HIGH or LOW). Depending on the circuit logic, this new object may not be needed. Then, the process 320 is terminated.

Figure 4:
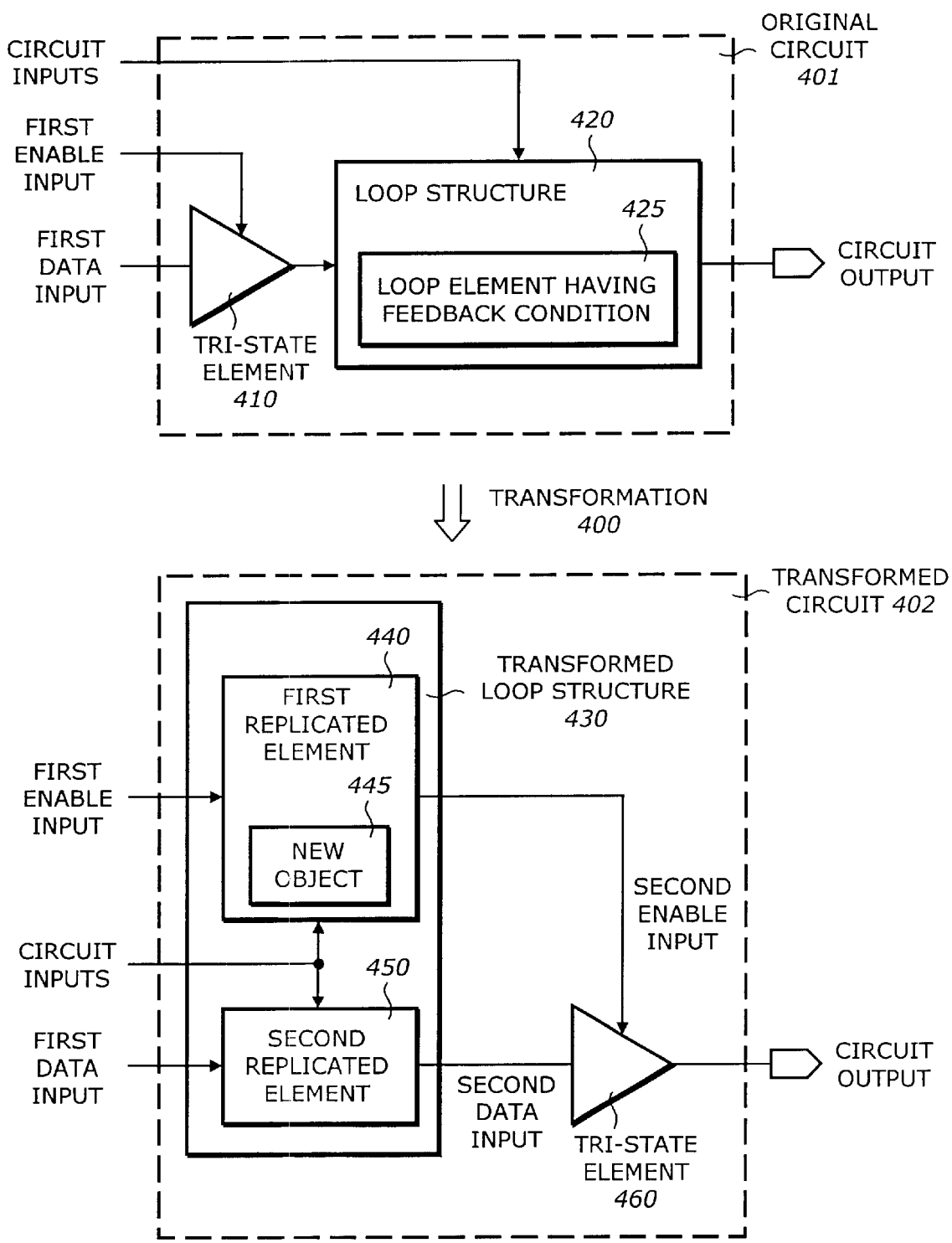
FIG. 4 is a diagram illustrating a transformation of a circuit according to one embodiment of the invention.

FIG. 4 is a diagram illustrating a transformation 400 of a circuit according to one embodiment of the invention. The transformation 400 transforms an original circuit 401 to a transformed circuit 402.

The original circuit 401 has a circuit output and includes a tri-state element 410 and a loop structure 420. The tri-state element 410 may be located inside the loop structure 420. The tri-state element 410 receives first tri-state inputs including at least a first enable input and a first data input. The loop structure 420 receives the circuit inputs and the output of the tri-state element. The loop structure 420 generates the circuit output based on the circuit inputs and the first tri-state inputs. The loop structure 420 includes a loop element 425 having a feedback connection.

The transformed circuit 402 includes a transformed loop structure 430 and a tri-state element 460. The transformed loop structure 430 includes first and second replicated elements 440 and 450. The first and second replicated elements 440 and 450 are the same internal connections and objects as the loop element 425, except that the first replicated element 440 may contain a new object 445. The new object 445 is created to maintain logic correctness for the second enable input. The first replicated element 440 receives the first enable input and provides a second enable input. The second replicated element 450 receives the first data input and provides a second data input. Both of the first and second replicated elements 440 and 450 receive the circuit inputs.

The tri-state element 460 is the original tri-state element 410 which is moved to the output side of the transformed loop structure 430. The tri-state element 460 receives the second enable input from the first replicated element 440 and the second data input from the second replicated element 450.

Figure 5A:
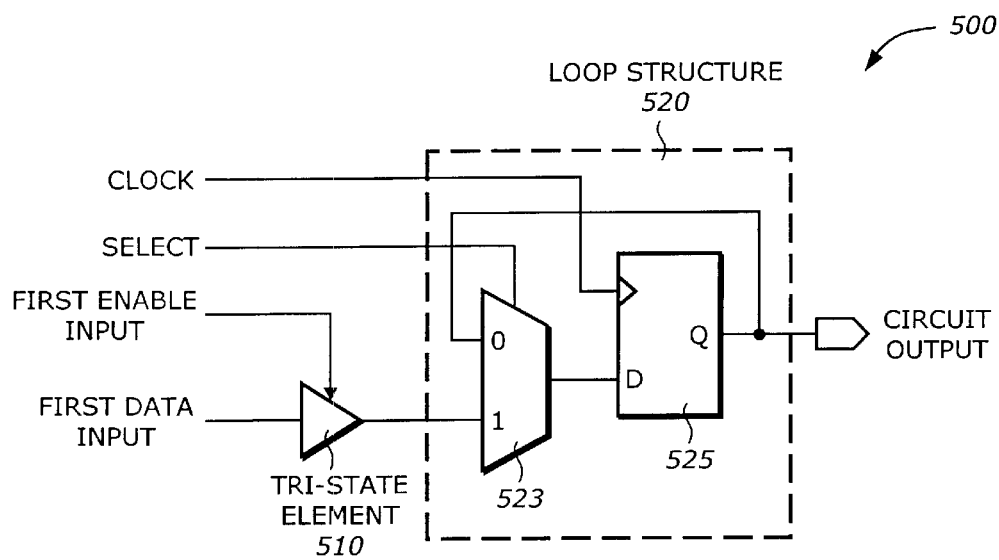
FIG. 5A is a diagram illustrating a circuit containing a loop structure and a tri-state element according to one embodiment of the present invention.

FIG. 5A is a diagram illustrating a circuit 500 containing a loop structure and a tri-state element according to one embodiment of the present invention. The circuit 500 includes a tri-state element 510 and a loop structure 520. The circuit 500 has a circuit output and four inputs: a clock input, a select input, a first enable input, and a first data input.

The tri-state element 510 receives the first tri-state inputs including the first enable input and the first data input. In the example shown in FIG. 5A, the tri-state element 510 performs a logic function of a buffer, i.e., the output is the same as the input when enabled, and is high impedance when disabled. For example, when the first enable input is at an enable logic level (e.g., HIGH), the tri-state element 510 generates the output as the first data input. When the first enable input is at a disable logic level (e.g., LOW), the tri-state element 510 generates a high impedance output. As is known by one skilled in the art, the tri-state element 510 may be any tri-state circuit having a tri-statable output.

The loop structure 520 has at least a loop element in a feedback connection. The feedback connection connects the output of a first device to the input of the first device or the input of another device that is coupled to the first device. The inputs to the loop structure 520 include the inputs to elements of the loop structure 520 and the output of the tri-state element 510. The output of the loop structure 520 is the circuit output. The loop structure 520 provides the circuit output as function of the clock input, the select input, the first enable input, and the first data input. In at least one combination of these inputs, the loop structure propagates the output of the tri-state element 510 to the circuit output.

In the example shown in FIG. 5A, the loop structure 520 includes a multiplexer 523 and a D flip-flop 525. The multiplexer 523 has two inputs, one is the output of the tri-state element 510 and one is the feedback signal from the output of the flip-flop 525, or the circuit output. The multiplexer 523 is controlled by the select input. The flip-flop 525 is clocked by the clock input. The D input to the flip-flop 525 is the output of the multiplexer 523.

Let d1, e1, s, and clk are the first data input, the first enable input, the select input, and the clock input. The operation of the circuit 500 is described in the following truth table at the rising edge of the clk signal.

TABLE 1

Truth table for the circuit 500

| e1 | s | circuit output |
|---|---|---|
| 0 | 0 | previous circuit output |
| 0 | 1 | high impedance* |
| 1 | 0 | previous circuit output |
| 1 | 1 | d1 |

Note that the high impedance shown in the above table is the desirable output. In the operation of the circuit 500, when the tri-state element 510 generates a high impedance output and the loop structure 520 is set up to propagate or pass this high impedance output to the circuit output, the logic arrangement of the loop structure 520 may not perform properly. This is because the flip-flop 525 does not have a tri-state output and therefore cannot generate a high impedance output. For design synthesis using an HDL, it is desirable to pass or push the high impedance output of the tri-state element 510 across the boundary to the circuit output. To do so, the technique described in FIG. 3 is used to transform the circuit 500 so that the tri-state element 510 provides the circuit output.

Figure 5B:
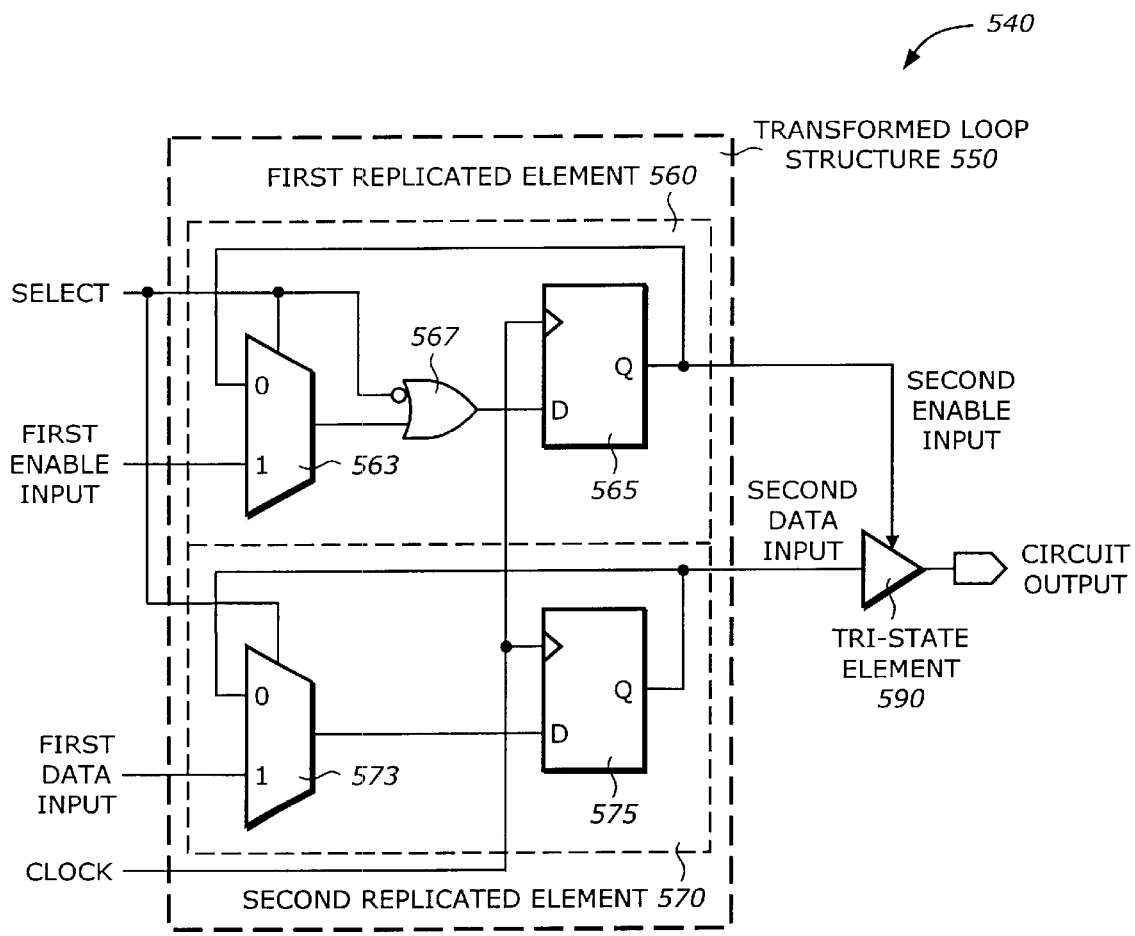
FIG. 5B is a diagram illustrating a transformed circuit of the circuit shown in FIG. 5A according to one embodiment of the present invention.

FIG. 5B is a diagram illustrating a transformed circuit 540 of the circuit shown in FIG. 5A according to one embodiment of the present invention. The transformed circuit 540 includes a transformed loop structure 550 and a tri-state element 590.

The transformed loop structure 550 includes first and second replicated elements 560 and 570 of the loop structure 520 shown in FIG. 5B. The first replicated element 560 includes a first replicated multiplexer 563, a first replicated flip-flop 565, and a logic gate 567. The second replicated element 570 includes a second replicated multiplexer 573 and a second replicated flip-flop 575. The multiplexer 523 in FIG. 5B is replicated into the first replicated multiplexer 563 and the second replicated multiplexer 573. The flip-flop 525 in FIG. 5B is replicated into the first replicated flip-flop 565 and the second replicated flip-flop 575. The logic gate 567 is used to ensure the logic of the circuit 500 remains unchanged. In the example of the circuit shown in FIG. 5, the logic gate 567 is a OR-gate having the select in put as an inverted input. The first replicated multiplexer 563, the logic gate 567, and the first replicated flip-flop 565 form the first replicated element 560. The second replicated multiplexer 573 and the second replicated flip-flop 575 form the second replicated element 570.

The internal structure of the corresponding replicated elements remains essentially the same as in the original loop element. The first replicated multiplexer 563 takes the first enable input as one of its inputs. The second replicated multiplexer 573 takes the first data input as one of its inputs. The feedback connections are essentially the same as in the original loop element. The output of the first replicated flip-flop 565 is fed back to the other input of the first replicated multiplexer 563. The output of the second replicated flip-flop 575 is fed back to the other input of the second replicated multiplexer 573. The logic gate 567 is inserted between the first replicated multiplexer 563 and the first replicated flip-flop 565.

The original tri-state element 510 in FIG. 5A is moved to the other side of the transformed loop structure 560 to become the tri-state element 590. The tri-state element 590 receives a second enable input from the output of the first replicated flip-flop 565 and a second data input from the output of the second replicated flip-flop 575.

When the select input is LOW, the flip-flop 565 generates a HIGH at the second enable input because the transforming logic gate 580 passes a logic HIGH to its D input. The tri-state element 590 is therefore enabled. Since the input to the tri-state element 590 is the output of the flip-flop 575, the tri-state element 590 provides an output which is the previous output based on the feedback connection of the multiplexer 573. This corresponds to the first and third rows of the truth table shown in Table 1.

When the select input is HIGH, the output of the flip-flop 565 follows the first enable input. If the first enable input is LOW, indicating a high impedance output, the output of the flip-flop 565 is LOW, disabling the tri-state element 590. Therefore, the circuit output is high impedance, corresponding to the second row of the truth table in Table 1. Note that this high impedance is the actual high impedance provided by a tri-state element, not merely a "logical" high impedance as in the circuit 500 shown in FIG. 5A. If the first enable input is HIGH, the flip-flop 565 generates a high second enable input to the tri-state element 590. The tri-state element 590 then passes the first data input to the circuit output. This corresponds to the fourth row of the truth table in Table 1.

Therefore, the transformed circuit 550 performs the same logic function as the original circuit 500 shown in FIG. 5. In addition, the transformed circuit 550 is able to provide an actual high impedance output.

Figure 6A:
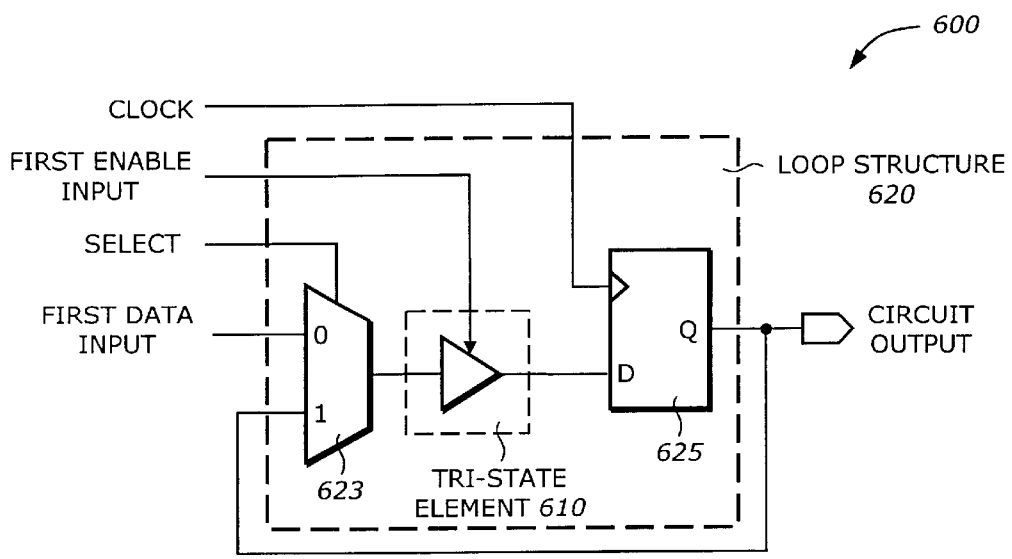
FIG. 6A is a diagram illustrating a circuit containing a loop structure and a tri-state element inside the loop structure according to one embodiment of the present invention.

FIG. 6A is a diagram illustrating a circuit 600 containing a loop structure and a tri-state element inside the loop structure according to one embodiment of the present invention. The circuit 600 includes a tri-state element 610 and a loop structure 620. The circuit 600 has a circuit output and four inputs: a clock input, a select input, a first enable input, and a first data input.

In this example, the tri-state element 610 is inserted inside the loop structure 620. The loop structure 620 includes a multiplexer 623 and a flip-flop 625. The multiplexer 623 receives the first data input as one of its inputs and the feedback output of the flip-flop 625 as the other input.

Let s, e1, and d1 be the select input, the first enable input, and the first data input. The operation of the circuit 600 is describes in the following truth table.

TABLE 2

Truth table for the circuit 600 in FIG. 6A

| S | e1 | circuit output |
|---|----|----------------|
| 0 | 0  | high impedance* |
| 0 | 1  | d1 |
| 1 | 0  | high impedance* |
| 1 | 1  | previous circuit output |

*Note that the high impedance output is a logical high impedance as propagated from the output of the tri-state element 610 to the circuit output.

Figure 6B:
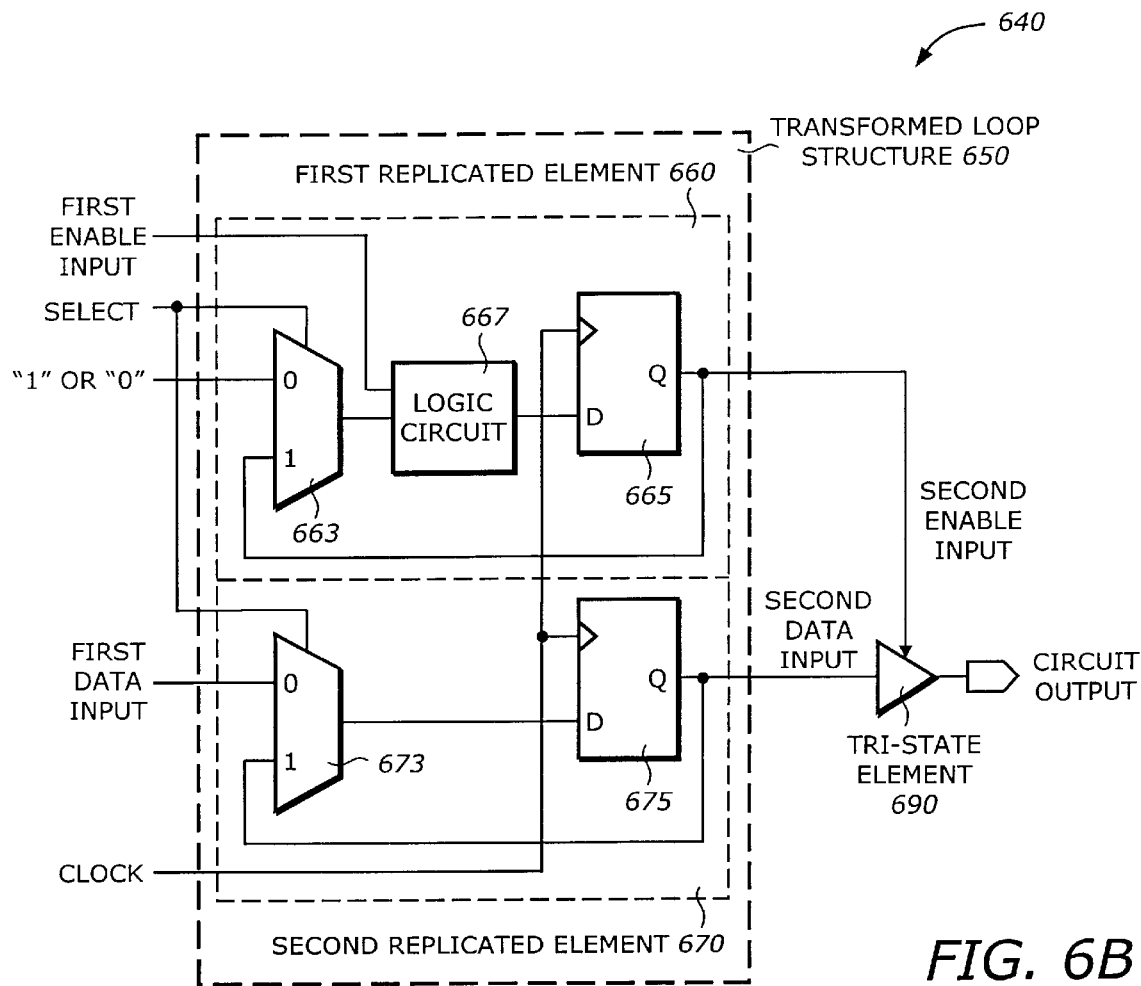
FIG. 6B is a diagram illustrating a transformed circuit of the circuit shown in FIG. 6A according to one embodiment of the present invention.

FIG. 6B is a diagram illustrating a transformed circuit 640 of the circuit shown in FIG. 6A according to one embodiment of the present invention. The transformed circuit 640 includes a transformed loop structure 650 and a tri-state element 690.

The transformed loop structure 650 includes first and second replicated elements 660 and 670. The first replicated element 660 includes a multiplexer 663, a logic circuit 667, and a flip-flop 665. The second replicated element 670 includes a multiplexer 673 and a flip-flop 675. The first and second replicated elements 660 and 670 have essentially the same internal connections as in the original loop structure 620 in FIG. 6A, except that the first replicated element has a new object. The new object includes the logic circuit 667 and a connection of one input to the multiplexer 663 to a logic level (e.g., HIGH).

The tri-state element 610 in the original circuit 600 shown in FIG. 6A is moved across the loop structure 620 to become the tri-state element 690. The tri-state element 690 receives the second enable input from the first replicated element 660 and the second data input from the second replicated element 670.

The logic circuit 667 is used to allow the first replicated element 660 to assert the second enable input according to the logic condition of the circuit 600 shown in FIG. 6A. The logic circuit 667 essentially is an identity buffer that provides an output to be the same as the first enable input regardless of the select input. The output of the multiplexer 663 may be disconnected from the logic circuit 667. When the first enable input is LOW, the flip-flop 665 generates a LOW level on the second enable input, disabling the tri-state element 690. Therefore, the circuit output becomes high impedance, corresponding to the first and the third rows of the truth table in Table 2. This high impedance output is the actual high impedance state as provided by the tri-state element and not merely a "logical" high impedance state as propagated by the flip-flop 625 in the original circuit 600 in FIG. 6A. When the first enable input is HIGH, the flip-flop 665 generates a HIGH level on the second enable input, enabling the tri-state element 690. The circuit output therefore takes on the value of the second data input. When the select input is LOW, the flip-flop 675 propagates the first data input to the second data input, corresponding to the second row of the truth table in Table 2. When the select input is HIGH, the flip-flop 675 generates the previous circuit output to the second data input, corresponding to the fourth row of the truth table in Table 2.

The technique of the present invention allows the circuit to generate actual high impedance state without affecting other circuit behavior. In addition, timing and logic consistencies can be maintained. The technique also reduces the number of logic elements leading to efficient designs.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
    identifying a circuit having a loop structure and a tri-state element, the circuit providing a circuit output, the loop structure containing at least a loop element in a feedback connection, the tri-state element receiving first tri-state inputs; and
    transforming the circuit so that the tri-state element is moved across the loop structure to provide the circuit output.

2. The method of claim 1 wherein transforming the circuit comprises:
    transforming the loop structure such that the loop structure receives the first tri-state inputs and provides second tri-state inputs; and
    moving the tri-state element to output of the loop structure, the moved tri-state element receiving the second tri-state inputs.

3. The method of claim 2 wherein the first tri-state inputs include a first enable input and a first data input.

4. The method of claim 3 wherein transforming the loop structure comprises:
    replicating the loop element into first and second replicated elements, the first replicated element having a first replicated input and a first replicated output, the second replicated element having a second replicated input and a second replicated output;
    connecting the first enable input to the first replicated input; and
    connecting the first data input to the second replicated input.

5. The method of claim 4 wherein the second tri-state inputs include a second enable input and a second data input.

6. The method of claim 5 wherein transforming the loop structure further comprises:
    connecting the first replicated output to the second enable input; and
    connecting the second replicated output to the second data input.

7. The method of claim 6 wherein transforming the loop structure further comprises:
    creating a new object in the first replicated element such that the first replicated element asserts the first replicated output based on logic condition of the circuit.

8. The method of claim 7 wherein creating the new object comprises:
    inserting a logic circuit in the first replicated element; and
    connecting at least one input of the first replicated element to a logic level.

9. The method of claim 1 wherein the loop element includes at least one of a combinational circuit and a sequential circuit.

10. The method of claim 9 wherein the combinational circuit contains at least one of a logic gate, a multiplexer, and a buffer; and wherein the sequential circuit contains at least one of a flip-flop, a register, and a latch.

11. A computer program product comprising:
a machine useable medium having program code embedded therein, the program code comprising:
computer readable program code to identify a circuit having a loop structure and a tri-state element, the circuit providing a circuit output, the loop structure containing at least a loop element in a feedback connection, the tri-state element receiving first tri-state inputs; and
computer readable program code to transform the circuit so that the tri-state element is moved across the loop structure to provide the circuit output.

12. The computer program product of claim 11 wherein the computer readable program code to transform the circuit comprises:
computer readable program code to transform the loop structure such that the loop structure receives the first tri-state inputs and provides second tri-state inputs; and
computer readable program code to move the tri-state element to output of the loop structure, the moved tri-state element receiving the second tri-state inputs.

13. The computer program product of claim 12 wherein the first tri-state inputs include a first enable input and a first data input.

14. The computer program product of claim 13 wherein the computer readable program code to transform the loop structure comprises:
computer readable program code to replicate the loop element into first and second replicated elements, the first replicated element having a first replicated input and a first replicated output, the second replicated element having a second replicated input and a second replicated output;
computer readable program code to connect the first enable input to the first replicated input; and
computer readable program code to connect the first data input to the second replicated input.

15. The computer program product of claim 14 wherein the second tri-state inputs include a second enable input and a second data input.

16. The computer program product of claim 15 wherein the computer readable program code to transform the loop structure further comprises:
computer readable program code to connect the first replicated output to the second enable input; and
computer readable program code to connect the second replicated output to the second data input.

17. The computer program product of claim 16 wherein the computer readable program code to transform the loop structure further comprises:
computer readable program code to create a new object in the first replicated element such that the first replicated element asserts the first replicated output based on logic condition of the circuit.

18. The computer program product of claim 17 wherein the computer readable program code to create the new object comprises:
computer readable program code to insert a logic circuit in the first replicated element; and
computer readable program code to connect at least one input of the first replicated element to a logic level.

19. The computer program product of claim 11 wherein the loop element includes at least one of a combinational circuit and a sequential circuit.

20. The computer program product of claim 19 wherein the combinational circuit contains at least one of a logic gate, a multiplexer, and a buffer; and wherein the sequential circuit contains at least one of a flip-flop, a register, and a latch.

21. A system comprises:
a processor;
a memory coupled to the processor, the memory having program code, the program code when executed by the processor causing the processor to:
identify a circuit having a loop structure and a tri-state element, the circuit providing a circuit output, the loop structure containing at least a loop element in a feedback connection, the tri-state element receiving first tri-state inputs, and
transform the circuit so that the tri-state element is moved across the loop structure to provide the circuit output.

22. The system of claim 21 wherein the program code causing the processor to transform the circuit causes the processor to:
transform the loop structure such that the loop structure receives the first tri-state inputs and provides second tri-state inputs; and
move the tri-state element to output of the loop structure, the moved tri-state element receiving the second tri-state inputs.

23. The system of claim 22 wherein the first tri-state inputs include the first enable input and a first data input.

24. The system of claim 23 wherein the program code causing the processor to transform the loop structure causes the processor to:
replicate the loop element into first and second replicated elements, the first replicated element having the first replicated input and the first replicated output, the second replicated element having the second replicated input and the second replicated output;
connect the first enable input to the first replicated input; and
connect the first data input to the second replicated input.

25. The system of claim 24 wherein the second tri-state inputs include a second enable input and a second data input.

26. The system of claim 25 wherein the program code causing the processor to transform the loop structure causes the processor to:
connect the first replicated output to the second enable input; and
connect the second replicated output to the second data input.

27. The system of claim 26 wherein the program code causing the processor to transform the loop structure further causes the processor to:
create a new object in the first replicated element such that the first replicated element asserts the first replicated output based on logic condition of the circuit.

28. The system of claim 27 wherein the program code causing the processor to create the new object causes the processor to:
insert a logic circuit in the first replicated element; and
connect at least one input of the first replicated element to a logic level.

29. The system of claim 21 wherein the loop element includes at least one of a combinational circuit and a sequential circuit.

30. The system of claim 29 wherein the combinational circuit contains at least one of a logic gate, a multiplexer, and a buffer; and wherein the sequential circuit contains at least one of a flip-flop, a register, and a latch.

* * * * *